(12) United States Patent
Hanssen et al.

(10) Patent No.: US 8,952,927 B2
(45) Date of Patent: *Feb. 10, 2015

(54) SELF-CAPACITANCE MEASUREMENT WITH COMPENSATED CAPACITANCE

(75) Inventors: Ingar Hanssen, Trondheim (NO); Rian Whelan, Drogheda (IE)

(73) Assignee: Atmel Corporation, San Jose, CA (US)

( * ) Notice: Subject to any disclaimer, the term of this patent is extended or adjusted under 35 U.S.C. 154(b) by 79 days.

This patent is subject to a terminal disclaimer.

(21) Appl. No.: 13/475,644

(22) Filed: May 18, 2012

(65) Prior Publication Data

US 2013/0307811 A1 Nov. 21, 2013

(51) Int. Cl.
*G06F 3/041* (2006.01)
*G06F 3/045* (2006.01)
*G06F 3/033* (2013.01)
*G06F 3/02* (2006.01)
*G06F 3/042* (2006.01)

(52) U.S. Cl.
USPC ........... 345/174; 345/173; 345/158; 345/156; 345/169; 178/18.01; 178/18.05; 178/18.06; 178/18.08; 178/18.09

(58) Field of Classification Search
USPC ........... 200/600; 324/658–690; 345/173–178
See application file for complete search history.

(56) References Cited

U.S. PATENT DOCUMENTS

| | | | |
|---|---|---|---|
| 6,157,170 A * | 12/2000 | Noda et al. ............... | 320/132 |
| 7,663,607 B2 | 2/2010 | Hotelling | |
| 7,864,503 B2 | 1/2011 | Chang | |
| 7,875,814 B2 | 1/2011 | Chen | |
| 7,920,129 B2 | 4/2011 | Hotelling | |
| 8,031,094 B2 | 10/2011 | Hotelling | |
| 8,031,174 B2 | 10/2011 | Hamblin | |
| 8,040,326 B2 | 10/2011 | Hotelling | |
| 8,049,732 B2 | 11/2011 | Hotelling | |
| 8,179,381 B2 | 5/2012 | Frey | |
| 8,217,902 B2 | 7/2012 | Chang | |
| 8,599,167 B2 | 12/2013 | Joharapurkar et al. | |
| 8,723,824 B2 | 5/2014 | Myers | |
| 2008/0158175 A1 | 7/2008 | Hotelling et al. | |
| 2008/0179112 A1 * | 7/2008 | Qin et al. ............... | 178/18.06 |
| 2008/0309635 A1 | 12/2008 | Matsuo | |

(Continued)

FOREIGN PATENT DOCUMENTS

WO   WO 2012/129247   9/2012

OTHER PUBLICATIONS

U.S. Appl. No. 61/454,936, filed Mar. 21, 2011, Myers.

(Continued)

*Primary Examiner* — Sumati Lefkowitz
*Assistant Examiner* — Joseph Fox
(74) *Attorney, Agent, or Firm* — Baker Botts LLP

(57) ABSTRACT

In one embodiment, a method includes dividing a first amount of charge between a capacitance of a touch sensor and a compensation capacitor. The division of the first amount of charge results in a first voltage at an input node. The method also includes applying a reference voltage at the input node. The application of the reference voltage at the input node induces a second amount of charge proportional to a difference between the first voltage and the reference voltage on an integration capacitor. The method also includes determining a first difference between the first voltage and the reference voltage based on a second amount of charge on the integration capacitor; and determining whether a touch input to the touch sensor has occurred based on the first difference.

17 Claims, 8 Drawing Sheets

(56) References Cited

U.S. PATENT DOCUMENTS

| | | |
|---|---|---|
| 2009/0315854 A1 | 12/2009 | Matsuo |
| 2010/0164889 A1 | 7/2010 | Hristov et al. |
| 2011/0279407 A1* | 11/2011 | Kim et al. .................. 345/174 |
| 2012/0242588 A1 | 9/2012 | Myers |
| 2012/0242592 A1 | 9/2012 | Rothkopf |
| 2012/0243151 A1 | 9/2012 | Lynch |
| 2012/0243719 A1 | 9/2012 | Franklin |
| 2013/0076612 A1 | 3/2013 | Myers |
| 2013/0307812 A1 | 11/2013 | Hanssen |
| 2013/0307813 A1 | 11/2013 | Hanssen |

OTHER PUBLICATIONS

U.S. Appl. No. 61/454,950, filed Mar. 21, 2011, Lynch.
U.S. Appl. No. 61/454,894, filed Mar. 21, 2011, Rothkopf.
I. Hanssen, U.S. Appl. No. 13/475,691, Non-final rejection. Nov. 18, 2013.
I. Hanssen, U.S. Appl. No. 13/475,691, Terminal disclaimer. Mar. 18, 2014.
I. Hanssen, U.S. Appl. No. 13/475,691, Response to non-final rejection. Mar. 18, 2014.
I. Hanssen, U.S. Appl. No. 13/475,691, Notice of Allowance. Apr. 23, 2014.
I. Hanssen, U.S. Appl. No. 13/475,750, Non-final rejection. Nov. 18, 2013.
I. Hanssen, U.S. Appl. No. 13/475,750, Terminal disclaimer. Mar. 18, 2014.
I. Hanssen, U.S. Appl. No. 13/475,750, Response to non-final rejection. Mar. 18, 2014.
I. Hanssen, U.S. Appl. No. 13/475,750, Non-final Rejection. Jul. 16, 2014.

* cited by examiner

SELF-CAPACITANCE MEASUREMENT WITH COMPENSATED CAPACITANCE

TECHNICAL FIELD

This disclosure generally relates to touch sensors.

BACKGROUND

A touch sensor may detect the presence and location of a touch or the proximity of an object (such as a user's finger or a stylus) within a touch-sensitive area of the touch sensor overlaid on a display screen, for example. In a touch-sensitive-display application, the touch sensor may enable a user to interact directly with what is displayed on the screen, rather than indirectly with a mouse or touch pad. A touch sensor may be attached to or provided as part of a desktop computer, laptop computer, tablet computer, personal digital assistant (PDA), smartphone, satellite navigation device, portable media player, portable game console, kiosk computer, point-of-sale device, or other suitable device. A control panel on a household or other appliance may include a touch sensor.

There are a number of different types of touch sensors, such as (for example) resistive touch screens, surface acoustic wave touch screens, and capacitive touch screens. Herein, reference to a touch sensor may encompass a touch screen, and vice versa, where appropriate. When an object touches or comes within proximity of the surface of the touch sensor, a change in capacitance may occur within the touch screen at the location of the touch or proximity. A touch-sensor controller may process the change in capacitance to determine its position on the touch screen.

DESCRIPTION OF EXAMPLE EMBODIMENTS

Figure 1:
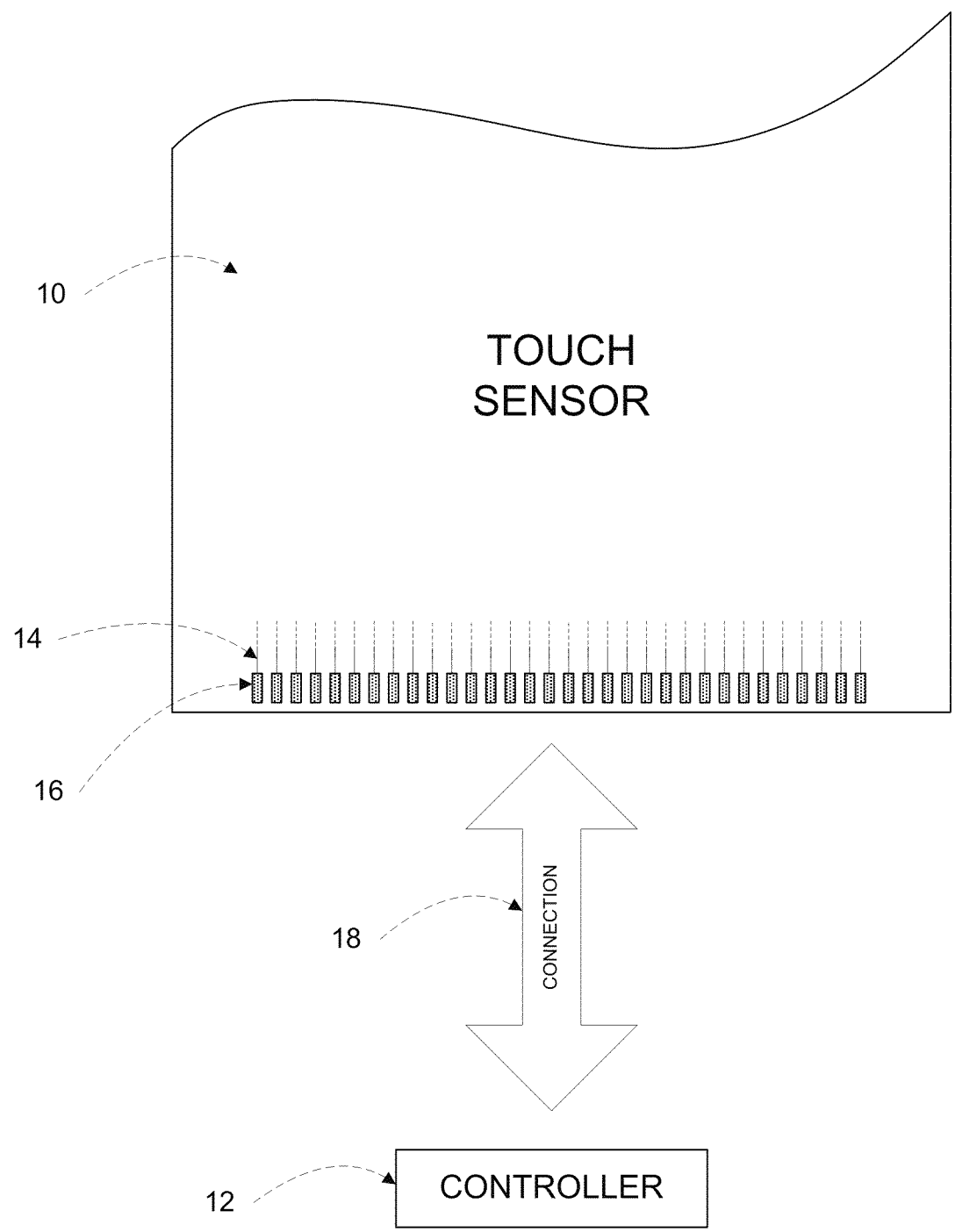
FIG. 1 illustrates an example array of touch sensors with an example touch-sensor controller.

FIG. 1 illustrates an example touch sensor array with an example touch-sensor controller. Touch sensor array 10 and touch-sensor controller 12 may detect the presence and location of a touch or the proximity of an object within a touch-sensitive area of touch sensor array 10. Herein, reference to a touch sensor array may encompass both the touch sensor and its touch-sensor controller, where appropriate. Similarly, reference to a touch-sensor controller may encompass both the touch-sensor controller and its touch sensor array, where appropriate. Touch sensor array 10 may include one or more touch-sensitive areas, where appropriate. Touch sensor array 10 may include an array of electrodes disposed on one or more substrates, which may be made of a dielectric material. Herein, reference to a touch sensor array may encompass both the electrodes of the touch sensor and the substrate(s) that they are disposed on, where appropriate. Alternatively, where appropriate, reference to a touch sensor array may encompass the electrodes of the touch sensor, but not the substrate(s) that they are disposed on.

An electrode may be an area of conductive material forming a shape, such as for example a disc, square, rectangle, thin line, other suitable shape, or suitable combination of these. One or more cuts in one or more layers of conductive material may (at least in part) create the shape of an electrode, and the area of the shape may (at least in part) be bounded by those cuts. In particular embodiments, the conductive material of an electrode may occupy approximately 100% of the area of its shape. As an example and not by way of limitation, an electrode may be made of indium tin oxide (ITO) and the ITO of the electrode may occupy approximately 100% of the area of its shape (sometimes referred to as 100% fill), where appropriate. In particular embodiments, the conductive material of an electrode may occupy substantially less than 100% of the area of its shape. As an example and not by way of limitation, an electrode may be made of fine lines of metal or other conductive material (FLM), such as for example copper, silver, or a copper- or silver-based material, and the fine lines of conductive material may occupy approximately 5% of the area of its shape in a hatched, mesh, or other suitable pattern. Herein, reference to FLM encompasses such material, where appropriate. Although this disclosure describes or illustrates particular electrodes made of particular conductive material forming particular shapes with particular fill percentages having particular patterns, this disclosure contemplates any suitable electrodes made of any suitable conductive material forming any suitable shapes with any suitable fill percentages having any suitable patterns.

Where appropriate, the shapes of the electrodes (or other elements) of a touch sensor array 10 may constitute in whole or in part one or more macro-features of the touch sensor array 10. One or more characteristics of the implementation of those shapes (such as, for example, the conductive materials, fills, or patterns within the shapes) may constitute in whole or in part one or more micro-features of the touch sensor array 10. One or more macro-features of a touch sensor array 10 may determine one or more characteristics of its functionality, and one or more micro-features of the touch sensor array 10 may determine one or more optical features of the touch sensor, such as transmittance, refraction, or reflection.

A mechanical stack may contain the substrate (or multiple substrates) and the conductive material forming the electrodes of touch sensor array 10. As an example and not by way of limitation, the mechanical stack may include a first layer of optically clear adhesive (OCA) beneath a cover panel. The cover panel may be clear and made of a resilient material suitable for repeated touching, such as for example glass, polycarbonate, or poly(methyl methacrylate) (PMMA). This disclosure contemplates any suitable cover panel made of any suitable material. The first layer of OCA may be disposed between the cover panel and the substrate with the conductive material forming the electrodes. The mechanical stack may also include a second layer of OCA and a dielectric layer (which may be made of PET or another suitable material, similar to the substrate with the conductive material forming the electrodes). As an alternative, where appropriate, a thin coating of a dielectric material may be applied instead of the second layer of OCA and the dielectric layer. The second layer of OCA may be disposed between the substrate with the conductive material making up the electrodes and the dielectric layer, and the dielectric layer may be disposed between the second layer of OCA and an air gap to a display of a device including touch sensor array 10 and touch-sensor controller 12. As an example only and not by way of limitation, the cover panel may have a thickness of approximately 1 millimeter (mm); the first layer of OCA may have a thickness of approximately 0.05 mm; the substrate with the conductive material forming the electrodes may have a thickness of approximately 0.05 mm; the second layer of OCA may have a thickness of approximately 0.05 mm; and the dielectric layer may have a thickness of approximately 0.05 mm. Although this disclosure describes a particular mechanical stack with a particular number of particular layers made of particular materials and having particular thicknesses, this disclosure contemplates any suitable mechanical stack with any suitable number of any suitable layers made of any suitable materials and having any suitable thicknesses. As an example and not by way of limitation, in particular embodiments, a layer of adhesive or dielectric may replace the dielectric layer, second layer of OCA, and air gap described above, with there being no air gap to the display.

One or more portions of the substrate of touch sensor array 10 may be made of polyethylene terephthalate (PET) or another suitable material. This disclosure contemplates any suitable substrate with any suitable portions made of any suitable material. In particular embodiments, the electrodes in touch sensor array 10 may be made of ITO in whole or in part. In particular embodiments, the electrodes in touch sensor array 10 may be made of fine lines of metal or other conductive material. As an example and not by way of limitation, one or more portions of the conductive material may be copper or copper-based and have a thickness of approximately 5 microns ($\mu m$) or less and a width of approximately 10 $\mu m$ or less. As another example, one or more portions of the conductive material may be silver or silver-based and similarly have a thickness of approximately 5 $\mu m$ or less and a width of approximately 10 $\mu m$ or less. This disclosure contemplates any suitable electrodes made of any suitable material.

Touch sensor array 10 may implement a capacitive form of touch sensing. In a self-capacitance implementation, touch sensor array 10 may include an array of electrodes that may each form a capacitive node. A pulsed or alternating voltage applied to the electrode (by touch-sensor controller 12) may induce a charge on the electrode, and the amount of charge induced may be susceptible to external influence (such as a touch or the proximity of an object). When an object touches or comes within proximity of the capacitive node, a change in capacitance may occur at the capacitive node and touch-sensor controller 12 may measure the change in capacitance. By measuring changes in capacitance throughout the array 10, touch-sensor controller 12 may determine the position of the touch or proximity within the touch-sensitive area(s) of touch sensor array 10. This disclosure contemplates any suitable form of capacitive touch sensing, where appropriate.

For a self-capacitance implementation, electrodes may be disposed in a pattern on a single substrate. Although this disclosure describes particular configurations of particular electrodes forming particular nodes, this disclosure contemplates any suitable configuration of any suitable electrodes forming any suitable nodes. Moreover, this disclosure contemplates any suitable electrodes disposed on any suitable number of any suitable substrates in any suitable patterns.

As described above, a change in capacitance at a capacitive node of touch sensor array 10 may indicate a touch or proximity input at the position of the capacitive node. Touch-sensor controller 12 may detect and process the change in capacitance to determine the presence and location of the touch or proximity input. Touch-sensor controller 12 may then communicate information about the touch or proximity input to one or more other components (such as one or more central processing units (CPUs)) of a device that includes touch sensor array 10 and touch-sensor controller 12, which may respond to the touch or proximity input by initiating a function of the device (or an application running on the device). Although this disclosure describes a particular touch-sensor controller having particular functionality with respect to a particular device and a particular touch sensor array, this disclosure contemplates any suitable touch-sensor controller having any suitable functionality with respect to any suitable device and any suitable touch sensor array.

Touch-sensor controller 12 may be one or more integrated circuits (ICs), such as for example general-purpose microprocessors, microcontrollers, programmable logic devices or arrays, application-specific ICs (ASICs). In particular embodiments, touch-sensor controller 12 comprises analog circuitry, digital logic, and digital non-volatile memory. In particular embodiments, touch-sensor controller 12 is disposed on a flexible printed circuit (FPC) bonded to the substrate of touch sensor array 10, as described below. The FPC may be active or passive, where appropriate. In particular embodiments, multiple touch-sensor controllers 12 are disposed on the FPC. Touch-sensor controller 12 may include a processor unit, a drive unit, a sense unit, and a storage unit. The drive unit may supply drive signals to the electrodes of touch sensor array 10. The sense unit may sense charge at the capacitive nodes of touch sensor array 10 and provide measurement signals to the processor unit representing capacitances at the capacitive nodes. The processor unit may control the supply of drive signals to the electrodes by the drive unit and process measurement signals from the sense unit to detect and process the presence and location of a touch or proximity input within the touch-sensitive area(s) of touch sensor array 10. The processor unit may also track changes in the position of a touch or proximity input within the touch-sensitive area(s) of touch sensor array 10. The storage unit may store programming for execution by the processor unit, including programming for controlling the drive unit to supply drive signals to the drive electrodes, programming for processing measurement signals from the sense unit, and other suitable programming, where appropriate. Although this disclosure describes a particular touch-sensor controller having a particular implementation with particular components, this disclosure contemplates any suitable touch-sensor controller having any suitable implementation with any suitable components.

Tracks 14 of conductive material disposed on the substrate of touch sensor array 10 may couple the electrodes of touch sensor 10 to connection pads 16, also disposed on the substrate of touch sensor array 10. As described below, connection pads 16 facilitate coupling of tracks 14 to touch-sensor controller 12. Tracks 14 may extend into or around (e.g. at the edges of) the touch-sensitive area(s) of touch sensor array 10. Particular tracks 14 may provide drive connections for coupling touch-sensor controller 12 to electrodes of touch sensor array 10, through which the drive unit of touch-sensor controller 12 may supply drive signals to the electrodes. Other tracks 14 may provide sense connections for coupling touch-sensor controller 12 to electrodes of touch sensor 10, through which the sense unit of touch-sensor controller 12 may sense charge at the capacitive nodes of touch sensor array 10. Tracks 14 may be made of fine lines of metal or other conductive material. As an example and not by way of limitation, the conductive material of tracks 14 may be copper or copper-based and have a width of approximately 100 μm or less. As another example, the conductive material of tracks 14 may be silver or silver-based and have a width of approximately 100 μm or less. In particular embodiments, tracks 14 may be made of ITO in whole or in part in addition or as an alternative to fine lines of metal or other conductive material. Although this disclosure describes particular tracks made of particular materials with particular widths, this disclosure contemplates any suitable tracks made of any suitable materials with any suitable widths. In addition to tracks 14, touch sensor array 10 may include one or more ground lines terminating at a ground connector (which may be a connection pad 16) at an edge of the substrate of touch sensor array 10 (similar to tracks 14).

Connection pads 16 may be located along one or more edges of the substrate, outside the touch-sensitive area(s) of touch sensor array 10. As described above, touch-sensor controller 12 may be on an FPC. Connection pads 16 may be made of the same material as tracks 14 and may be bonded to the FPC using an anisotropic conductive film (ACF). Connection 18 may include conductive lines on the FPC coupling touch-sensor controller 12 to connection pads 16, in turn coupling touch-sensor controller 12 to tracks 14 and to the electrodes of touch sensor array 10. In another embodiment, connection pads 16 may be connected to an electro-mechanical connector (such as a zero insertion force wire-to-board connector); in this embodiment, connection 18 may not need to include an FPC. This disclosure contemplates any suitable connection 18 between touch-sensor controller 12 and touch sensor 10.

Figure 2A:
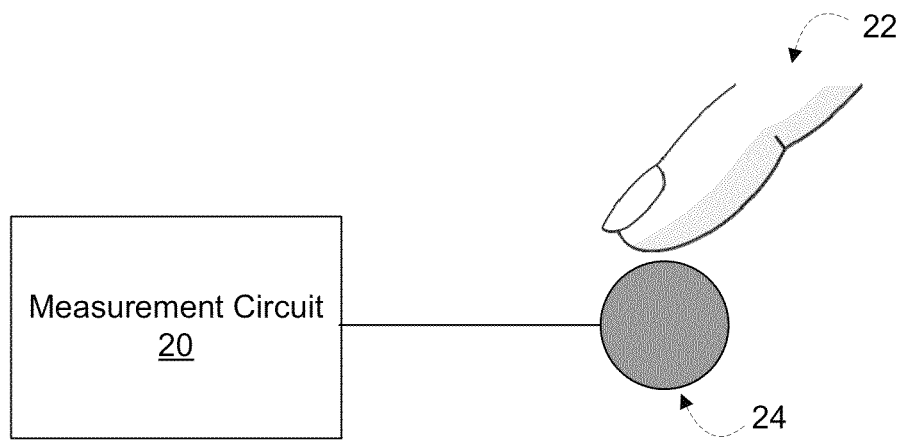
FIGS. 2A-B illustrate a schematic of an example self-capacitance measurement.
Figure 2B:
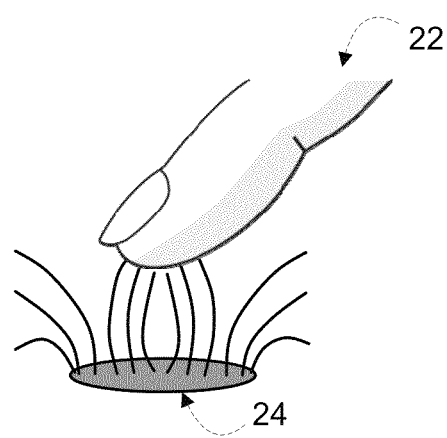

FIGS. 2A-B illustrate a schematic of an example self-capacitance measurement. In the example of FIG. 2A, an electrode 24 of the touch sensor is coupled to a measurement circuit 20. As described below, electrode 24 forms a capacitance to ground that is distributed in free space. In particular embodiments, the capacitance to ground may include multiple elements, such as for example, capacitance of the tracks in the silicon, tracks on the printed circuit board (PCB), electrodes 24 made from conductive material (ITO, copper mesh, etc.), or an object providing a touch input. Electrode 24 has capacitive coupling to ground through the surrounding objects that are galvanically or capacitively connected to ground. As described above, measurement circuit 20 of the touch-sensor controller transmits a drive signal and senses a signal indicative of a touch or proximity input, from for example a finger 22, through electrode 24. In particular embodiments, measurement circuit 20 of the touch-sensor controller generates the drive signal transmitted by electrode 24 and senses the capacitance to ground. The capacitance of the surrounding material includes at least in part, the capacitance between electrode 24 and ground with finger 22 providing the touch or proximity input. As an example and not by way of limitation, the capacitance provided by finger 22 providing the touch or proximity input may add 5-10% of the capacitance sensed by electrode 24.

In the example of FIG. 2B, the drive signal transmitted by electrode 24 generates an electric field that emanates from electrode 24 to a signal ground of the touch sensor. The signal ground is galvanically or capacitively coupled to ground. The presence of finger 22 affects the electric field and in turn the amount of charge sensed at electrode 24 by measurement circuit 20. As finger 22 approaches electrode 24, the capacitance between electrode 24 and ground detected by the measurement circuit 20 increases. Although this disclosure describes the measurement circuit being integrated with a touch-sensor controller, this disclosure contemplates a measurement circuit being a discrete circuit or part of any suitable circuit.

Figure 3:
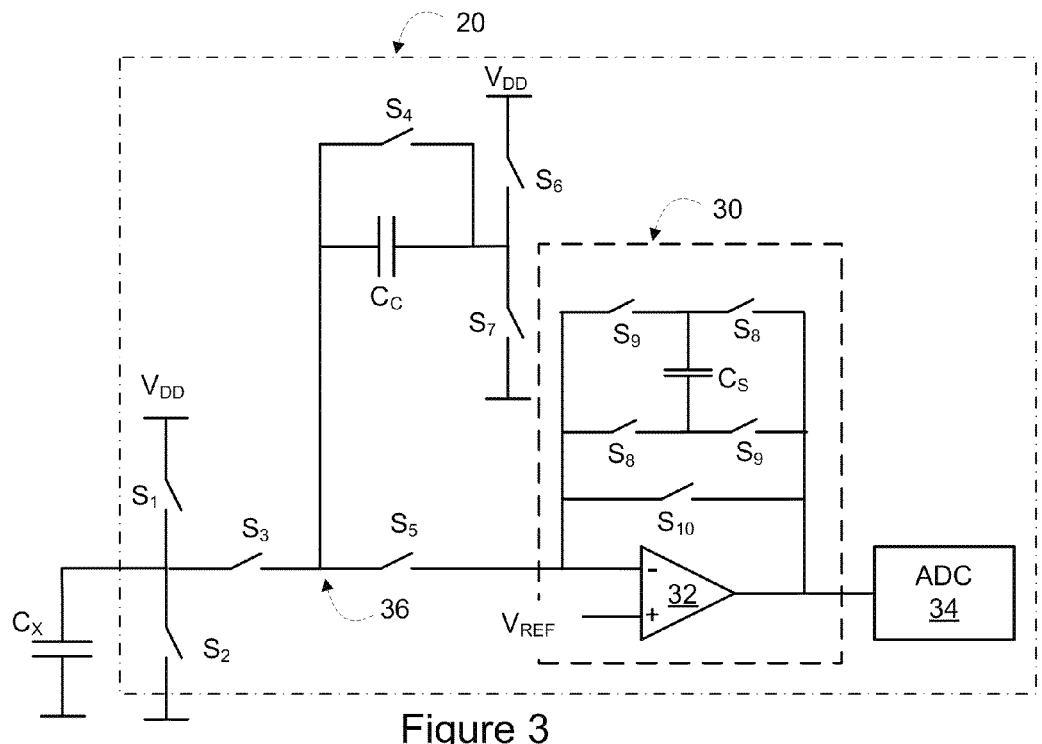
FIG. 3 illustrates an example circuit schematic with an internal chip compensation capacitor for self-capacitance measurements.

FIG. 3 illustrates an example circuit schematic with a compensation capacitor for self-capacitance measurements. Self-capacitance measurement circuit 20 determines a change of a touch sensor capacitance schematically illustrated in the example of FIG. 3 by measurement capacitance $C_X$. In particular embodiments, measurement capacitance $C_X$ is formed in part between an electrode of the touch sensor and other conductive material of the touch sensor (not shown) that is capacitively or galvanically coupled to ground. As an example and not by way of limitation, the conductive material of the touch sensor may include portions of tracks, pins, or internal network of the touch sensor. As described above, the electrode of the touch sensor senses the capacitance between the finger providing the touch or proximity input through the electric field transmitted by the electrode.

The portion of measurement capacitance $C_X$ that includes the electrode is coupled to a voltage $V_{DD}$ or ground through switches $S_1$ and $S_2$, respectively. In particular embodiments, voltage $V_{DD}$ is a supply voltage of the touch sensor. In other particular embodiments, switch $S_1$ may be coupled to a voltage other than voltage $V_{DD}$. Switch $S_3$ couples the electrode portion of measurement capacitance $C_X$ to a compensation capacitor $C_C$. One terminal of compensation capacitor $C_C$ is coupled to voltage $V_{DD}$ or ground through switches $S_6$ and $S_7$, respectively. In particular embodiments, switch $S_6$ may be coupled to a voltage other than $V_{DD}$. The terminals of compensation capacitor $C_C$ are coupled together through switch $S_4$. Compensation capacitor $C_C$ is coupled to integrator circuit 30 through switch $S_5$. As described below, input node 36 of self-capacitance measurement circuit 20 functions as an input node to integrator circuit 30. The output of integrator circuit 30 is coupled to analog-to-digital converter (ADC) 34.

Integrator circuit 30 includes an operational amplifier (op-amp) 32 with a positive input coupled to reference voltage $V_{REF}$. As an example and not by way of limitation, reference voltage $V_{REF}$ may be substantially equal to half of a supply voltage of the touch sensor. Op-amp 32 is coupled to integration capacitor $C_S$ through switches $S_8$ and $S_9$. The terminals of integration capacitor $C_S$ are coupled together through switch $S_{10}$. Switches $S_8$ and $S_9$ determine the configuration of integration capacitor $C_S$ with respect to the negative input and the output of op-amp 32. With switches $S_9$ open and switches $S_8$ closed, the terminals of integration capacitor $C_S$ are coupled in a particular fashion to the negative input and the output of op-amp 32. With switches $S_8$ open and switches $S_9$ closed, the terminals of integration capacitor $C_S$ are coupled in an opposite fashion to the configuration described above. In particular embodiments, reversing the configuration of the terminals of integration capacitor $C_S$ between measurements acts to reverse the polarity of charge, and in turn the voltage, of integration capacitor $C_S$ accumulated during the subsequent measurement relative to polarity of charge of integration capacitor $C_S$ accumulated during the initial measurement, as described below. Although this disclosure describes and illustrates a particular arrangement of particular components for the self-capacitance measurement circuit and integrator circuit, this disclosure contemplates any suitable arrangement of any suitable components for the self-capacitance measurement circuit and integrator circuit. Moreover, this disclosure contemplates use of the self-capacitance measurement circuit for any suitable form of capacitive-touch sensing, such as for example mutual capacitance, where appropriate.

Figure 4:
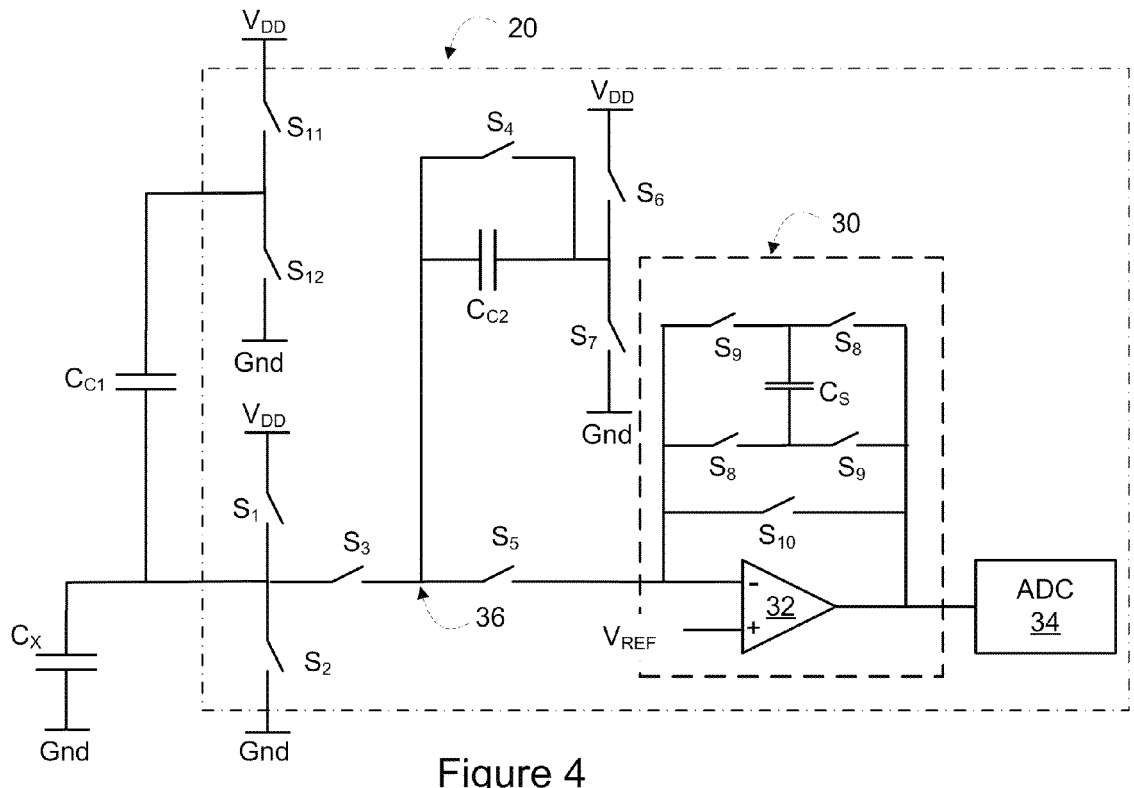
FIG. 4 illustrates another example circuit schematic for self-capacitance measurements.

FIG. 4 illustrates an example circuit schematic with an external compensation capacitor for self-capacitance measurements. As described above, self-capacitance measurement circuit 20 determines a change of a touch sensor capacitance schematically illustrated in the example of FIG. 4 by measurement capacitance $C_X$. In particular embodiments, measurement capacitance $C_X$ is formed in part between an electrode of the touch sensor and other conductive material of the touch sensor (not shown) that is capacitively or galvanically coupled to ground. As described above, the electrode of the touch sensor senses the capacitance between the finger providing the touch or proximity input through the electric field transmitted by the electrode.

The compensation capacitor for self-capacitance measurement circuit 20 is divided into compensation capacitor $C_{C2}$ that is internal to self-capacitance measurement circuit 20 and compensation capacitor $C_{C1}$ that is external to self-capacitance measurement circuit 20. As an example and not by way of limitation, the capacitance of compensation capacitor $C_{C1}$ is larger than the capacitance of compensation capacitor $C_{C2}$. As another example, the capacitance of external compensation capacitor $C_{C1}$ is fixed. The portion of measurement capacitance $C_X$ that includes the electrode is coupled to a voltage $V_{DD}$ or ground through switches $S_1$ and $S_2$, respectively. In particular embodiments, voltage $V_{DD}$ is a supply voltage of the touch sensor. A terminal of compensation capacitor $C_{C1}$ is coupled to the electrode of the touch sensor through measurement capacitance $C_X$. The other terminal of compensation capacitor $C_{C1}$ is coupled to voltage $V_{DD}$ or ground through switches $S_{11}$ and $S_{12}$, respectively. In particular embodiments, switches $S_1$, $S_6$ and $S_{11}$ may be coupled to a voltage other than $V_{DD}$.

Switch $S_3$ couples the electrode portion of measurement capacitance $C_X$ to a compensation capacitor $C_{C2}$. One terminal of compensation capacitor $C_{C2}$ is coupled to voltage $V_{DD}$ or ground through switches $S_6$ and $S_7$, respectively. The terminals of compensation capacitor $C_{C2}$ are coupled together through switch $S_4$. Compensation capacitor $C_{C1}$ is coupled to integrator circuit 30 through switches $S_3$ and $S_5$ and compensation capacitor $C_{C2}$ is coupled to integrator circuit 30 through switch $S_5$. As described below, input node 36 of self-capacitance measurement circuit 20 functions as an input node to integrator circuit 30. The output of integrator circuit 30 is coupled to analog-to-digital converter (ADC) 34.

Integrator circuit 30 includes an op-amp 32 with a positive input coupled to reference voltage $V_{REF}$. As an example and not by way of limitation, reference voltage $V_{REF}$ may be substantially equal to half of a supply voltage of the touch sensor. Op-amp 32 is coupled to integration capacitor $C_S$ through switches $S_8$ and $S_9$. The terminals of integration capacitor $C_S$ are coupled together through switch $S_{10}$. As described above, switches $S_8$ and $S_9$ determine the configuration of integration capacitor $C_S$ with respect to the negative input and the output of op-amp 32. With switches $S_9$ open and switches $S_8$ closed, the terminals of sampling capacitor $C_S$ are coupled in a particular fashion to the negative input and the output of op-amp 32. With switches $S_8$ open and switches $S_9$ closed, the terminals of integration capacitor $C_S$ are coupled in an opposite fashion to the configuration described above. As an example and not by way of limitation, the input signal to switches $S_9$ is an inverted signal of the input to switches $S_8$, such that only one of two configurations of integration capacitor $C_S$ is selected at a given time. As described above, reversing the configuration of the terminals of integration capacitor $C_S$ between measurements acts to reverse the polarity of charge, and in turn the voltage, of integration capacitor $C_S$ accumulated during the subsequent measurement relative to charge of integration capacitor $C_S$ accumulated during the initial measurement, as described below.

Although this disclosure describes and illustrates a particular arrangement of particular components for the self-capacitance measurement circuit and integrator circuit, this disclosure contemplates any suitable arrangement of any suitable components for the self-capacitance measurement circuit and integrator circuit. Although this disclosure describes and illustrates a particular arrangement of particular components for the self-capacitance measurement circuit and integrator circuit, this disclosure contemplates any suitable arrangement of any suitable components for the self-capacitance measurement circuit and integrator circuit. Moreover, this disclosure contemplates use of the self-capacitance measurement circuit for any suitable form of capacitive-touch sensing, such as for example mutual capacitance, where appropriate.

Figure 5A:
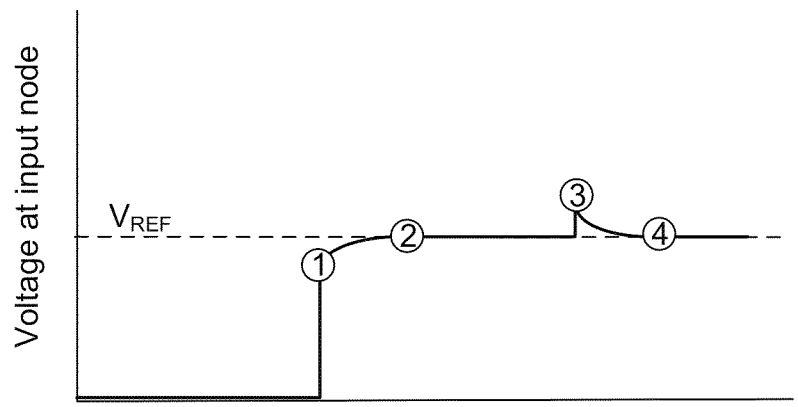
FIGS. 5A-B illustrate a voltage at an input node and integration capacitor over time for an example self-capacitance measurement.
Figure 5B:
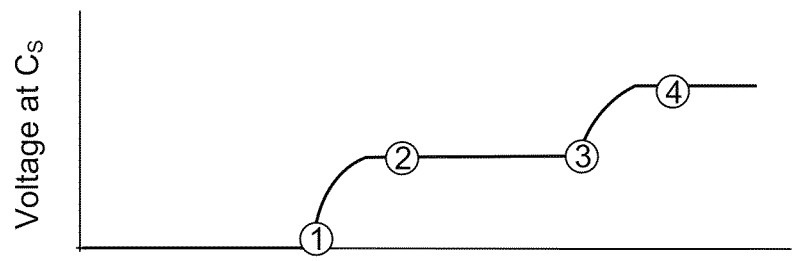

FIGS. 5A-B illustrate a voltage at an input node and integration capacitor over time for an example self-capacitance measurement. Prior to time point 1, input node 36 is floating and the voltage of input node 36 depends on the amount of charge of measurement capacitance $C_X$ and compensation capacitor $C_C$ or compensation capacitor $C_{C2}$, in the case where an external compensation capacitor is used. At time point 1, a voltage is applied to compensation capacitor $C_C$ or compensation capacitors $C_{C1}$ and $C_{C2}$. As an example and not by way of limitation, the voltage applied to compensation capacitor $C_C$ or compensation capacitors $C_{C1}$ and $C_{C2}$ is a supply voltage of the touch sensor.

The application of the voltage results in an amount of charge being divided between measurement capacitance $C_X$ and compensation capacitor $C_C$ or compensation capacitors $C_{C1}$ and $C_{C2}$. As an example and not by the way of limitation, measurement capacitance $C_X$ may be coupled in series with compensation capacitor $C_C$ or compensation capacitors $C_{C1}$ and $C_{C2}$ with the voltage being applied to compensation capacitor $C_C$ or compensation capacitors $C_{C1}$ and $C_{C2}$. The division of charge between measurement capacitance $C_X$ and compensation capacitor $C_C$ or compensation capacitors $C_{C1}$ and $C_{C2}$ results in the voltage at input node 36 being determined by the capacitance of compensation capacitor $C_C$ or compensation capacitors $C_{C1}$ and $C_{C2}$ relative to measurement capacitance $C_X$.

As described above, a touch or proximity input on the electrode of the touch sensor affects the amount of charge of measurement capacitance $C_X$. In the case when the capacitance of compensation capacitor $C_C$ or compensation capacitors $C_{C1}$ and $C_{C2}$ is substantially equal to measurement capacitance $C_X$, the amount of charge is substantially equally divided between measurement capacitance $C_X$ and compensation capacitor $C_C$ or the sum of compensation capacitors $C_{C1}$ and $C_{C2}$. In particular embodiments, the capacitance of compensation capacitor $C_C$ or compensation capacitors $C_{C1}$ and $C_{C2}$ is calibrated, such that the capacitance of compensation capacitor $C_C$ or the sum of compensation capacitors $C_{C1}$ and $C_{C2}$ is substantially equal to measurement capacitor $C_X$ in the absence of a touch or proximity input at the touch sensor, as described below. As an example and not by way of limitation, in the absence of a touch or proximity input at the electrode, the voltage at input node 36 after charge division is substantially equal to reference voltage $V_{REF}$.

In the presence of the touch or proximity input, the perceived capacitance of measurement capacitance $C_X$ is increased by the capacitance between the finger and the electrode. In this case, the resulting voltage at input node 36 is lower compared to the voltage in the absence of the touch or proximity input on the electrode. In the example of FIG. 5A, at time point 2, the voltage at input node 36 after charge division is below reference voltage $V_{REF}$ by an amount proportional to difference in capacitance between measurement capacitance $C_X$ and compensation capacitor $C_C$ or the sum of compensation capacitors $C_{C1}$ and $C_{C2}$.

At time point 2, the voltage of input node 36 is modified through application of reference voltage $V_{REF}$ at the negative terminal of the op-amp. As an example and not by way of limitation, reference voltage $V_{REF}$ is substantially equal to half of the supply voltage of the touch sensor. Application of reference voltage $V_{REF}$ at input node 36 results in the voltage changing from the voltage after the charge division to reference voltage $V_{REF}$. An amount of charge is transferred to integration capacitor $C_S$ of the integrator circuit. As illustrated in the example of FIG. 5B between time points 1 and 2, integrating the transferred amount of charge amplifies the difference between the voltage after charge division and reference voltage $V_{REF}$. In particular embodiments, the difference between the voltage at input node 36 after charge division and reference voltage $V_{REF}$ may be measured directly using the ADC output or indirectly through the output of the integrator circuit. A touch or proximity input is determined relative to a calibration voltage difference between measured the voltage after charge division and reference voltage $V_{REF}$ in the absence of a touch or proximity input.

LF noise may corrupt the input detected through the electrode of the touch sensor. As an example and not by way of limitation, low-frequency (LF) noise may originate from the power supply of the touch sensor operating at 50-60 Hz. As another example, LF noise may have a large amplitude, such as for example, of 100 volts or more. During a transfer of charge, a LF noise source may inject an amount of charge on measurement capacitance $C_X$. Depending on whether on the LF noise is positioned on the falling or rising slope of the LF waveform, the injected charge adds or subtracts charge into measurement capacitance $C_X$ as an offset to the modification of charge of measurement capacitance $C_X$ performed by the measurement circuit. In the case when sequential measurements are performed, the charge added or subtracted by the LF noise source appears as common-mode shift of the signals from measurement capacitance $C_X$. Depending on the measurement frequency, the common-mode shift may modify the amplitude or polarity of signals from measurement capacitance $C_X$.

The example self-capacitance measurement circuits of FIGS. 3 and 4 may be configured to perform a self-capacitance measurement with LF noise suppression. In the example of FIGS. 3 and 4, integration capacitor $C_S$ of the integrator circuit is configured by opening or closing switches $S_8$ and $S_9$. As described above, opening or closing switches $S_8$ and $S_9$ reverses the configuration of the terminals of integration capacitor $C_S$ between measurements acts to invert the polarity of the voltage at integration capacitor $C_S$. As an example and not by way of limitation, closing switches $S_8$ and opening switches $S_9$ is a particular configuration of integration capacitor $C_S$. If the polarity of the voltage at integration capacitor $C_S$ is inverted and the polarity subsequent measurement is inverted relative to the initial measurement, the effect of the two inversions is canceled resulting in a non-inverted signal. As described below, inverting the polarity of the voltage and combining the initial and subsequent measurements substantially suppresses LF offsets common to both measurements. As described above, the touch or proximity input is determined relative to a calibration difference of the voltage at input node 36 after the first and second charge division and reference voltage $V_{REF}$ in the absence of a touch or proximity input.

Between time points 2 and 3, the polarity of the voltage of integration capacitor $C_S$ is reversed through switches $S_8$ and $S_9$ and the charge of measurement capacitance $C_X$ is modified resulting in the voltage at measurement capacitance $C_X$ being substantially equal to the supply voltage of the touch sensor. Measurement capacitance $C_X$ is coupled in parallel to compensation capacitor $C_C$ or compensation capacitors $C_{C1}$ and $C_{C2}$ by coupling compensation capacitor $C_C$ or compensation capacitors $C_{C1}$ and $C_{C2}$ to ground. As described above, measurement capacitance $C_X$ is capacitively coupled to ground. Coupling measurement capacitance $C_X$ in parallel to compensation capacitor $C_C$ or compensation capacitors $C_{C1}$ and $C_{C2}$ results in an amount of charge being divided between measurement capacitance $C_X$ and compensation capacitor $C_C$ or compensation capacitors $C_{C1}$ and $C_{C2}$. As described above, the division of charge between measurement capacitance $C_X$ and compensation capacitor $C_C$ or compensation capacitors $C_{C1}$ and $C_{C2}$ results in the voltage at input node 36 being determined by the capacitance of compensation capacitor $C_C$ or compensation capacitors $C_{C1}$ and $C_{C2}$ relative to measurement capacitor $C_X$.

At time point 3, the voltage of input node 36 is modified through application of reference voltage $V_{REF}$ at the negative terminal of the op-amp. Application of reference voltage $V_{REF}$ at input node 36 results in the voltage changing from the voltage after the charge division to reference voltage $V_{REF}$. The transferred charge is integrated by the integrator circuit until time point 4, when the voltage at input node 36 is substantially equal to reference voltage $V_{REF}$. As an example and not by way of limitation, in the example of FIG. 5A, the transfer of charge decreases the voltage at input node 36 to reference voltage $V_{REF}$. In particular embodiments, the integrator circuit measures the transferred amount of charge that modifies the voltage at measurement capacitor $C_X$ from the voltage after charge division to reference voltage $V_{REF}$. The voltage at sampling capacitor $C_S$ varies by an amount proportional to the amount of transferred charge. As illustrated in the example of FIG. 5B between time points 3 and 4, inverting the polarity of the voltage at integration capacitor $C_S$ and with the polarity subsequent measurement being inverted relative to the initial measurement, the effect of the two inversions is canceled resulting in a non-inverted signal. Although this disclosure describes and illustrates particular relationships of the voltage at input node 36 relative to the reference voltage, this disclosure contemplates any suitable relationship of the voltage at input node 36 relative to the reference voltage, such as for example, the voltage at input node 36 being above, below, or substantially equal to the reference voltage.

LF noise present at time points 1 and 2 and time points 3 and 4 is observed as a common-mode offset in both measurements. For measurements performed within a relatively short period of time, the induced noise has the same polarity and amplitude, while the measured signals have same amplitude and opposite polarity. As described above, common-mode offsets may have a frequency that is lower than a measurement frequency and cause signal fluctuation. The noise offset of the self-capacitance measurement is suppressed by inverting the second voltage difference and associated noise component and subtracting the signal with the first voltage difference through configuration of switches $S_8$ and $S_9$. To avoid the cancellation of the measured signal, the polarity of the signal of one of the measurements, relative to reference voltage $V_{REF}$, is inverted at input node 36 prior to the subtraction of signals. As described above, the touch or proximity input is determined relative to a calibration difference of the voltage at input node 36 after charge division and reference voltage $V_{REF}$ without a touch or proximity input.

TABLE 1 illustrates an example sequence of operations for the example self-capacitance measurement circuit of FIG. 3. Step 2 applies a voltage to compensation capacitor $C_C$ coupled in series with measurement capacitance $C_X$. The charge division modifies the voltage at input node 36 to a voltage that is proportional to the capacitance of compensation capacitor $C_C$ relative to measurement capacitance $C_X$. As described above, the distribution of charge depends at least in part on whether a touch or proximity input is present on the electrode of the touch sensor. Step 3 measures the amount of charge modifying the voltage at input node 36 after the charge division to reference voltage $V_{REF}$, as described above. Steps 4 and 5, reverse the configuration of integration capacitor $C_S$ and couple compensation capacitor $C_C$ in parallel with measurement capacitance $C_X$. The parallel combination of compensation capacitor $C_C$ and measurement capacitance $C_X$ results in a second division of charge between compensation capacitor $C_C$ and measurement capacitance $C_X$. Although this disclosure describes and illustrates a particular sequence of steps in TABLE 1, this disclosure contemplates any suitable sequence of steps for performing self-capacitance measurements.

voltage to compensation capacitors $C_{C1}$ and $C_{C2}$ coupled in series with measurement capacitance $C_X$. The charge division modifies the voltage at input node 36 to a voltage that is proportional to the sum of the capacitance of compensation capacitors $C_{C1}$ and $C_{C2}$ relative to measurement capacitance $C_X$. As described above, the distribution of charge depends at least in part on whether a touch or proximity input is present on the electrode of the touch sensor. Step 3 measures the amount of charge modifying the voltage at input node 36 after the charge division to reference voltage $V_{REF}$, as described above. Steps 4 and 5, reverse the configuration of integration capacitor $C_S$ and couple compensation capacitors $C_{C1}$ and $C_{C2}$ in parallel with measurement capacitance $C_X$. The parallel combination of compensation capacitors $C_{C1}$ and $C_{C2}$ and measurement capacitance $C_X$ results in a second division of charge between compensation capacitors $C_{C1}$ and $C_{C2}$ and measurement capacitance $C_X$. Although this disclosure describes and illustrates a particular sequence of steps in

TABLE 1

| Step | $S_1$ | $S_2$ | $S_3$ | $S_4$ | $S_5$ | $S_6$ | $S_7$ | $S_8$ | $S_9$ | $S_{10}$ | Description |
|---|---|---|---|---|---|---|---|---|---|---|---|
| 1 | off | on | off | on | off | off | off | on | off | on | Discharge integration capacitor $C_S$, measurement capacitance Cx, and compensation capacitor Cc |
| 2 | off | off | on | off | off | on | off | on | off | off | Divide charge between measurement capacitance $C_X$ and compensation capacitor $C_C$ |
| 3 | off | off | on | off | on | off | off | on | off | off | Integrating charge from voltage difference between voltage after charge division and reference voltage $V_{REF}$ End point for single-sided measurement |
| 4 | on | off | off | on | off | off | off | on | off | off | Discharge compensation capacitor $C_C$ and charge sensor capacitance Cx to $V_{DD}$; and reverse configuration of integration capacitor $C_S$ |
| 5 | off | off | on | off | off | off | on | off | on | off | Couple compensation capacitor $C_C$ in parallel with measurement capacitance $C_X$ |
| 6 | off | off | on | off | on | off | off | off | on | off | Integrating charge from voltage difference between voltage after second charge division and reference voltage $V_{REF}$ |
| 7 | | | | | | | | | | | Determine touch input based on the voltage on the output of the integrator |

TABLE 2 illustrates an example sequence of operations for the example self-capacitance measurement circuit with an external compensation capacitor of FIG. 4. Step 2 applies a TABLE 2, this disclosure contemplates any suitable sequence of steps for performing differential self-capacitance measurements.

TABLE 2

| Step | $S_1$ | $S_2$ | $S_3$ | $S_4$ | $S_5$ | $S_6$ | $S_7$ | $S_8$ | $S_9$ | $S_{10}$ | $S_{11}$ | $S_{12}$ | Description |
|---|---|---|---|---|---|---|---|---|---|---|---|---|---|
| 1 | off | on | off | on | off | off | off | on | off | on | off | on | Discharge integration capacitor $C_S$, measurement capacitance Cx, and compensation capacitor Cc |
| 2 | off | off | on | off | off | on | off | on | off | off | on | off | Divide charge between measurement capacitance $C_X$ and compensation capacitors $C_{C1}$ and $C_{C2}$ |
| 3 | off | off | on | off | on | off | off | on | off | off | off | off | Integrating charge from voltage difference between voltage after charge division and reference voltage $V_{REF}$ End point for single-sided measurement |
| 4 | on | off | off | on | off | off | off | off | on | off | on | off | Discharge compensation capacitor $C_C$ and charge measurement capacitance Cx to $V_{DD}$; and reverse configuration of integration capacitor $C_S$ |
| 5 | off | off | on | off | off | off | on | off | on | off | off | on | Couple compensation capacitors $C_{C1}$ and $C_{C2}$ in parallel with measurement capacitance $C_X$ |
| 6 | off | off | on | off | on | off | off | off | on | off | off | off | Integrating charge from voltage difference between voltage after second charge division and reference voltage $V_{REF}$ |
| 7 | | | | | | | | | | | | | Determine touch input based on the voltage on the output of the integrator |

TABLE 3 illustrates an example sequence of operations for isolating the measurement capacitance of the example self-capacitance measurement circuit of FIG. 3. In particular embodiments, the example sequence of operations described and illustrated in TABLE 1, may be modified to isolate measurement capacitance $C_X$ from the measurement circuit during the transfer of charge. Step 2 applies a voltage to compensation capacitor $C_C$ coupled in series with measurement capacitance $C_X$. The charge division modifies the voltage at input node 36 to a voltage that is proportional to the capacitance of compensation capacitor $C_C$ relative to measurement capacitance $C_X$. As described above, the distribution of charge depends at least in part on whether a touch or proximity input is present on the electrode of the touch sensor. Step 3 measures the amount of charge modifying the voltage at input node 36 after the charge division to reference voltage $V_{REF}$, as described above. In particular embodiments, measurement capacitance $C_X$ is isolated from the measurement circuit by opening switch $S_5$. In other particular embodiments, the supply voltage of the touch sensor is applied to a terminal of compensation capacitor $C_C$.

Steps 4 and 5, reverse the configuration of integration capacitor $C_S$ and couple compensation capacitor $C_C$ in parallel with measurement capacitance $C_X$. The parallel combination of compensation capacitor $C_C$ and measurement capacitance $C_X$ results in a second division of charge between compensation capacitor $C_C$ and measurement capacitance $C_X$. Step 6 measures the amount of charge modifying the voltage at input node 36 after the second charge division to reference voltage $V_{REF}$, as described above. In particular embodiments, ground is applied to applied to the terminal of compensation capacitor $C_C$. Although this disclosure describes and illustrates a particular sequence of steps in TABLE 3, this disclosure contemplates any suitable sequence of steps for performing self-capacitance measurements. Moreover, this disclosure contemplates isolating the measurement capacitance for self-capacitance measurements for any suitable measurement circuit, such as for example a self-capacitance circuit with an external capacitance illustrated in FIG. 4.

Figure 6A:
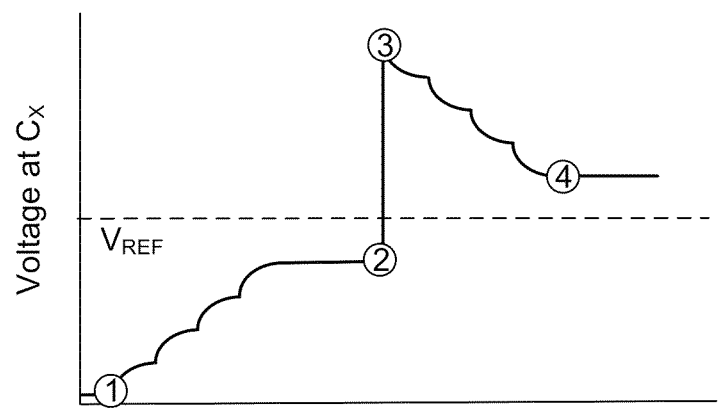
FIGS. 6A-B illustrate a voltage at a measurement capacitance and integration capacitor over time for another example self-capacitance measurement.
Figure 6B:
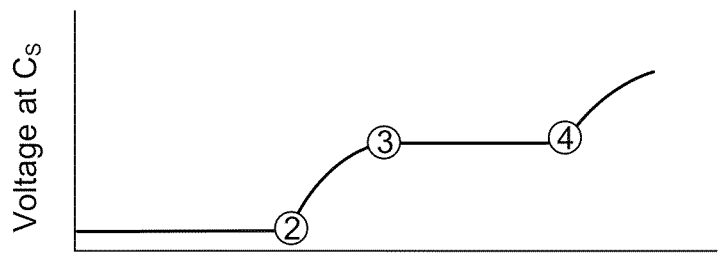

FIGS. 6A-B illustrate a voltage at a measurement capacitance and integration capacitor over time for an example burst-mode self-capacitance measurement. In particular embodiments, the example self-capacitance measurement circuit of FIG. 3 may be configured to operate in a burst mode. In the burst mode, charge transfers are performed a number of times that correspond to a burst length of the measurement. Repetition of discharging the measurement capacitance $C_X$ and transferring charge to integration capacitor $C_S$ increases the amount of charge, and in turn the signal, on integration capacitor $C_S$. As described above, a touch or proximity input on the electrode of the touch sensor effects the amount of charge, and in turn the voltage, at measurement capacitance $C_X$ formed at least in part from an electrode of the touch sensor. As an example and not by way of limitation, the capacitance of compensation capacitor $C_C$ may be significantly smaller than measurement capacitance $C_X$. At time point 1, the amount of charge of measurement capacitance $C_X$ is modified, resulting in the voltage at measurement capacitance $C_X$ being ground, as illustrated in the example of FIG. 6A. As an example and not by way of limitation, the amount of charge of measurement capacitance $C_X$ is modified by closing switch $S_2$, as illustrated in the example of FIG. 3. Between time points 1 and 2, compensation capacitor $C_C$ is discharged and charge divided between measurement capacitance $C_X$ and compensation capacitor $C_C$. In particular embodiments, the amount of charge is divided through application of the voltage and coupling measurement capacitance $C_X$ in series with compensation capacitor $C_C$. As an example and not by way of limitation, the voltage may be the supply voltage of the touch sensor. As described above, the discharging of compensation capacitor $C_C$ and the division of charge between measurement capacitance $C_X$ and compensation capacitor $C_C$ may be performed a pre-determined number of times corresponding to the burst length of the measurement.

In the example of FIG. 6A, between time points 1 and 2, the voltage at measurement capacitor $C_X$ incrementally increases after each cycle of discharging compensation capacitor $C_C$ and dividing charge between measurement capacitance $C_X$ and compensation capacitor $C_C$. The increase in the voltage of measurement capacitance $C_X$ increases the voltage at input node 36. At time point 2, the voltage of input node 36 is modified through application of reference voltage $V_{REF}$ at the negative terminal of the op-amp. Application of reference voltage $V_{REF}$ at input node 36 results in the voltage changing from the voltage after the charge division to reference voltage

TABLE 3

| Step | $S_1$ | $S_2$ | $S_3$ | $S_4$ | $S_5$ | $S_6$ | $S_7$ | $S_8$ | $S_9$ | $S_{10}$ | Description |
|---|---|---|---|---|---|---|---|---|---|---|---|
| 1 | off | on | off | on | off | off | off | on | off | on | Discharge integration capacitor $C_S$, measurement capacitance Cx, and compensation capacitor Cc |
| 2 | off | off | on | off | off | on | off | on | off | off | Divide charge between measurement capacitance $C_X$ and compensation capacitor $C_C$ |
| 3 | off | off | off | off | on | on | off | on | off | off | Isolate measurement capacitance $C_X$ from measurement circuit; apply voltage at compensation capacitor $C_C$; and integrating charge from voltage difference between voltage after charge division and reference voltage $V_{REF}$ End point for single-sided measurement |
| 4 | on | off | off | on | off | off | off | off | on | off | Discharge compensation capacitor $C_C$ and charge measurement capacitance Cx to $V_{DD}$; and reverse configuration of integration capacitor $C_S$ |
| 5 | off | off | on | off | off | off | on | off | on | off | Couple compensation capacitor $C_C$ in parallel with measurement capacitance $C_X$ |
| 6 | off | off | off | off | on | off | on | on | off | off | Isolate measurement capacitance $C_X$ from measurement circuit; apply ground at compensation capacitor $C_C$; and integrating charge from voltage difference between voltage after second charge division to reference voltage $V_{REF}$ |
| 7 | | | | | | | | | | | Determine touch input based on the voltage on the output of the integrator |

$V_{REF}$. An amount of charge is transferred to integration capacitor $C_S$ of the integrator circuit. As illustrated in the example of FIG. 6B between time points 2 and 3, integrating the transferred amount of charge amplifies the difference between the voltage at input node 36 and reference voltage $V_{REF}$. In particular embodiments, the difference between the charging voltage level and reference voltage $V_{REF}$ may be measured directly using the ADC output or indirectly through the output of the integrator circuit.

At time point 3, the amount of charge of measurement capacitance $C_X$ is modified, resulting in the voltage at measurement capacitance $C_X$ being a pre-determined voltage, as illustrated in the example of FIG. 6A. As an example and not by way of limitation, the amount of charge of measurement capacitance $C_X$ is modified by closing switch $S_1$ coupled to the supply voltage of the touch sensor, as illustrated in the example of FIG. 3. In particular embodiments, the configuration of the integration capacitor is reversed after time point 3. As an example and not by way of limitation, configuration of integration capacitor $C_S$ may be configured by opening or closing switches coupled to the terminals of $C_S$, as illustrated in the example of FIG. 3. Between time points 3 and 4, compensation capacitor $C_C$ is discharged and charge divided between measurement capacitance $C_X$ and compensation capacitor $C_C$. In particular embodiments, the amount of charge is divided by coupling the compensation capacitor $C_C$ to ground, thereby coupling measurement capacitance $C_X$ in parallel with compensation capacitor $C_C$. As described above, the discharging of compensation capacitor $C_C$ and the division of charge between measurement capacitance $C_X$ and compensation capacitor $C_C$ may be performed a pre-determined number of times corresponding to the burst length of the measurement.

In the example of FIG. 6A, between time points 3 and 4, the voltage at measurement capacitor $C_X$ incrementally decreases after each cycle of discharging compensation capacitor $C_C$ and dividing charge between measurement capacitance $C_X$ and compensation capacitor $C_C$. The decrease in the voltage of measurement capacitance $C_X$ decreases the voltage at input node 36. As described above, LF noise of the self-capacitance measurement is suppressed by inverting the second difference between the voltage at input node 36 after the second charge division and reference voltage $V_{REF}$ and associated noise component and subtracting the signal with the first difference. To avoid the cancellation of the measured signal, the polarity of the signal of one of the measurements at input node 36, relative to reference voltage $V_{REF}$, is inverted prior to the subtraction of signals, as illustrated in the example of FIG. 6B.

TABLE 4 illustrates an example sequence of operations for the example burst-mode self-capacitance measurement illustrated in FIGS. 6A-B. In particular embodiments, the example sequence of operations described and illustrated in TABLE 1, may be modified to perform a burst-mode self-capacitance measurement. Steps 2 and 3 discharge compensation capacitor $C_C$ and apply a voltage to compensation capacitor $C_C$ coupled in series with measurement capacitance $C_X$. As described above, the charge division modifies the voltage at input node 36 proportional to the capacitance of compensation capacitor $C_C$ relative to measurement capacitance $C_X$. The distribution of charge depends at least in part on whether a touch or proximity input is present on the electrode of the touch sensor. Steps 2 and 3 are performed a pre-determined number of times. Step 5 isolates measurement capacitance $C_X$ from the measurement circuit and measures the amount of charge modifying the voltage at input node 36 after the charge division to reference voltage $V_{REF}$, as described above. In particular embodiments, the supply voltage of the touch sensor is applied to a terminal of compensation capacitor $C_C$.

Step 6 reverses the configuration of integration capacitor $C_S$ and modifies the amount of charge of measurement capacitance $C_X$ resulting in the voltage at measurement capacitance $C_X$ being a pre-determined voltage. As an example and not by way of limitation, the pre-determined voltage may be the supply voltage of the touch sensor. In particular embodiments, configuration of integration capacitor $C_S$ may be configured by opening or closing switches coupled to the terminals of $C_S$, as illustrated in the example of FIG. 3. Steps 7 and 8 discharge compensation capacitor $C_C$ and couple compensation capacitor $C_C$ in parallel with measurement capacitance $C_X$. As an example and not by way of limitation, compensation capacitor $C_C$ may be coupled to ground by closing switch $S_7$, as illustrated in the example of FIG. 3. The parallel combination of compensation capacitor $C_C$ and measurement capacitance $C_X$ results in a second division of charge between compensation capacitor $C_C$ and measurement capacitance $C_X$.

Steps 7 and 8 are performed a pre-determined number of times corresponding to the burst length of the measurement. Step 8 measures the amount of charge modifying the voltage at input node 36 after the second charge division to reference voltage $V_{REF}$, as described above. In particular embodiments, ground is applied to the terminal of compensation capacitor $C_C$. Although this disclosure describes and illustrates a particular sequence of steps in TABLE 4, this disclosure contemplates any suitable sequence of steps for performing burst-mode self-capacitance measurements. Moreover, this disclosure contemplates performing burst-mode self-capacitance measurements for any suitable measurement circuit, such as for example a self-capacitance circuit with an external capacitance illustrated in FIG. 4.

TABLE 4

| Step | $S_1$ | $S_2$ | $S_3$ | $S_4$ | $S_5$ | $S_6$ | $S_7$ | $S_8$ | $S_9$ | $S_{10}$ | Description |
|---|---|---|---|---|---|---|---|---|---|---|---|
| 1 | off | on | off | on | off | off | off | on | off | on | Initial discharge integration capacitor $C_S$ |
| 2 | off | off | off | on | off | on | off | on | off | on | Discharge compensation capacitor $C_C$ |
| 3 | off | off | on | off | off | on | off | off | off | off | Divide charge between measurement capacitance $C_X$ and compensation capacitor $C_C$ |
| 4 | | | | | | | | | | | Burst mode-repeat steps 2 and 3 for pre-determined number of times |
| 5 | off | off | off | off | on | on | off | on | off | off | Integrating charge from voltage difference between voltage after charge division and reference voltage $V_{REF}$ End point for single-sided measurement |
| 6 | on | off | off | on | off | off | off | off | on | off | Modify the amount of charge of measurement capacitance $C_X$ and reverse configuration of integration capacitor $C_S$ |

TABLE 4-continued

| Step | $S_1$ | $S_2$ | $S_3$ | $S_4$ | $S_5$ | $S_6$ | $S_7$ | $S_8$ | $S_9$ | $S_{10}$ | Description |
|---|---|---|---|---|---|---|---|---|---|---|---|
| 7 | off | off | off | on | off | off | on | off | on | off | Discharge compensation capacitor $C_C$ |
| 8 | off | off | on | off | off | off | on | off | on | off | Couple compensation capacitor $C_C$ in parallel to measurement capacitance $C_X$ |
| 9 | | | | | | | | | | | Burst mode-repeat steps 7 and 8 pre-determined number of times |
| 10 | off | off | off | off | on | off | on | off | on | off | Integrating charge from voltage difference between voltage after second charge division and reference voltage $V_{REF}$ |
| 11 | | | | | | | | | | | Determine touch input based on the voltage on the output of the integrator |

The capacitance of compensation capacitor $C_C$ or internal compensation capacitor $C_{C2}$ is adjustable. The capacitance of the compensation capacitor $C_C$ may be calibrated to match measurement capacitance $C_X$ in the absence of a touch or proximity input. In particular embodiments, the calibration of compensation capacitor $C_C$ results in an output of the measurement circuit being substantially equal to the reference voltage. As an example and not by way of limitation, calibration of compensation capacitor $C_C$ may be performed using the steps described in TABLE 1 may be performed without a touch or proximity input at the electrode of the touch sensor. The output of the self-capacitance measurement in the absence of the touch input is compared with the reference voltage. In particular embodiments, the reference voltage is substantially equal to half of the supply voltage of the touch sensor. The capacitance of compensation capacitor $C_C$ or internal compensation capacitor $C_{C2}$ is recursively adjusted and compared with the reference voltage to find the value of compensation capacitor $C_C$ or internal compensation capacitor $C_{C2}$ that minimizes the difference between the output of the self-capacitance measurement circuit and the reference voltage. Although this disclosure describes calibration using a particular sequence of steps in TABLE 1, this disclosure contemplates any suitable sequence of steps for performing calibration of the compensation capacitor. Moreover, this disclosure contemplates performing calibration of the compensation capacitor for any suitable measurement circuit, such as for example a self-capacitance circuit with an external capacitance illustrated in FIG. 4.

Figure 7:
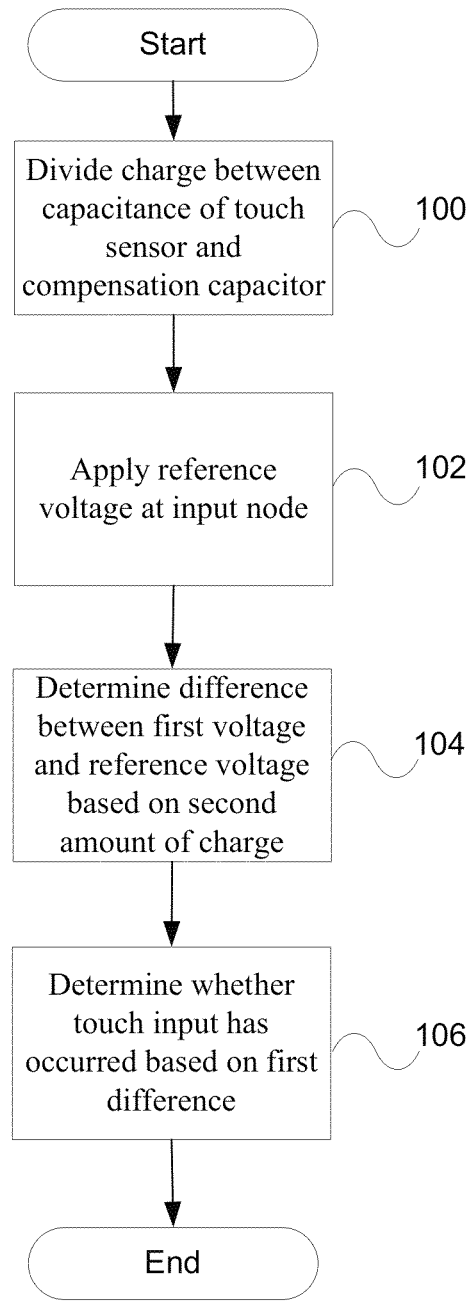
FIG. 7 illustrates an example method for self-capacitance measurements.

FIG. 7 illustrates an example method for self-capacitance measurements. The method may start at step 100, where a first amount of charge is divided between a capacitance of a touch sensor and a compensation capacitor. The division of the first amount of charge results in a first voltage at an input node. In particular embodiments, the division of charge is performed through coupling the compensation capacitor in series with the measurement capacitance and applying a voltage to the compensation capacitor. Step 102 applies a reference voltage at the input node. The application of the reference voltage at the input node induces a second amount of charge proportional to a difference between the first voltage and the reference voltage on an integration capacitor. In particular embodiments, the second amount of charge is integrated through an integrator circuit. In step 104, a first difference between the first voltage and the reference voltage is determined based on a second amount of charge on the integration capacitor. In particular embodiments, the output of the self-capacitance measurement circuit is transmitted to an ADC. At step 106, whether a touch input to the touch sensor has occurred is determined based on the first difference, at which point the method may end. In particular embodiments, the output of the measurement circuit is compared to an output value without a touch or proximity input. Although this disclosure describes and illustrates particular steps of the method of FIG. 7 as occurring in a particular order, this disclosure contemplates any suitable steps of the method of FIG. 7 occurring in any suitable order. Moreover, although this disclosure describes and illustrates particular components carrying out particular steps of the method of FIG. 7, this disclosure contemplates any suitable combination of any suitable components carrying out any suitable steps of the method of FIG. 7.

Figure 8:
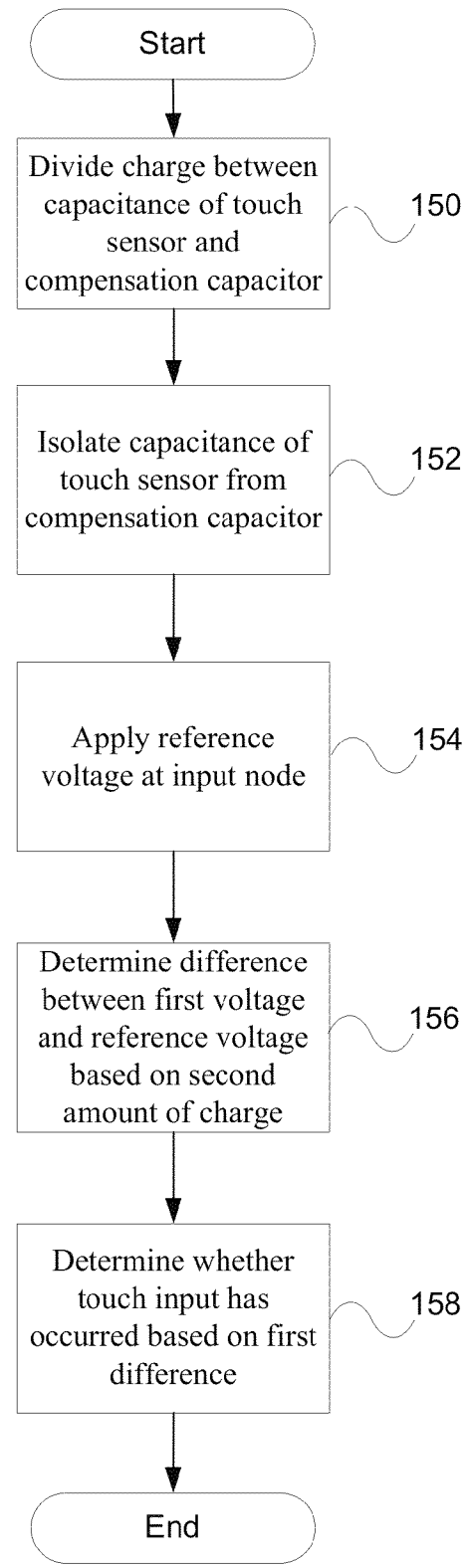
FIG. 8 illustrates another example method for self-capacitance measurements.

FIG. 8 illustrates an example method for a self-capacitance measurement with isolated measurement capacitance. The method may start at step 150, where a first amount of charge is divided between a capacitance of a touch sensor and a compensation capacitor. The division of the first amount of charge results in a first voltage at an input node. Step 152 isolates the measurement capacitance from the compensation capacitor. In step 154, a reference voltage is applied at the input node. The application of the reference voltage at the input node induces a second amount of charge proportional to a difference between the first voltage and the reference voltage on an integration capacitor. Step 156 determines a first difference between the first voltage and the reference voltage based on a second amount of charge on the integration capacitor. At step 158, whether a touch input to the touch sensor has occurred is determined based on the first difference, at which point the method may end. Although this disclosure describes and illustrates particular steps of the method of FIG. 8 as occurring in a particular order, this disclosure contemplates any suitable steps of the method of FIG. 8 occurring in any suitable order. Moreover, although this disclosure describes and illustrates particular components carrying out particular steps of the method of FIG. 8, this disclosure contemplates any suitable combination of any suitable components carrying out any suitable steps of the method of FIG. 8.

Figure 9:
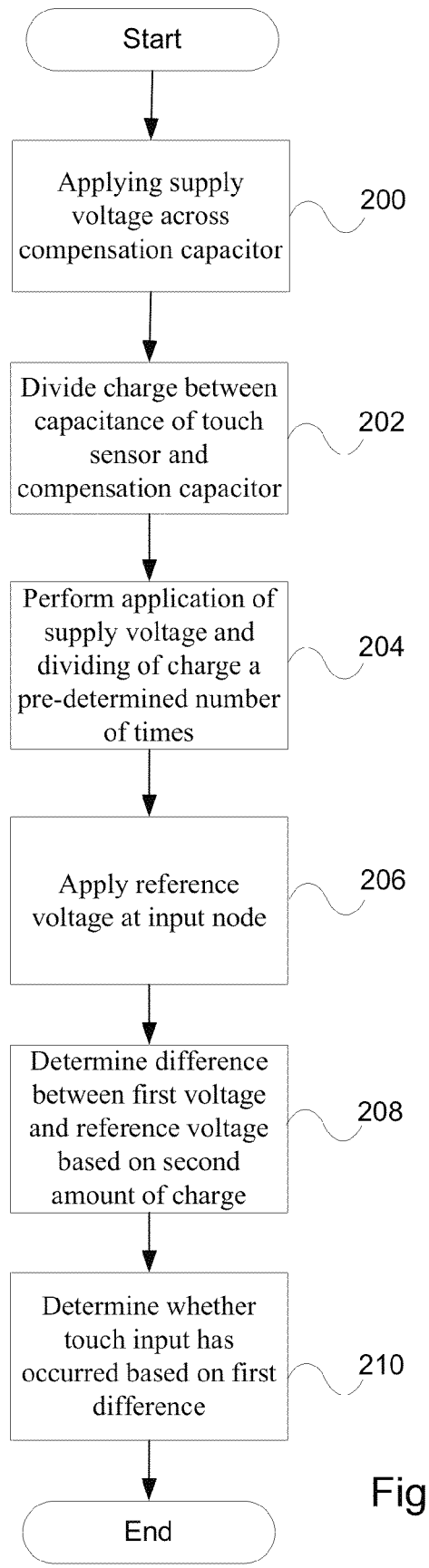
FIG. 9 illustrates another example method for self-capacitance measurements.

FIG. 9 illustrates an example method for a burst-mode self-capacitance measurement. The method may start at step 200, where a supply voltage is applied across a compensation capacitor. In particular embodiments, a switch coupling the terminals of the compensation capacitor to a supply voltage is closed. Step 202 divides charge between a capacitance of a touch sensor and the compensation capacitor. In particular embodiments, the division of charge is performed through coupling the compensation capacitor in series with the measurement capacitance and applying a voltage to the compensation capacitor. In step 204, the application of the supply voltage and the dividing of charge is performed a pre-determined number of times. Repetition of application of the supply voltage and the dividing of charge induces a first amount of charge on the compensation capacitor and results in a first voltage at an input node. At step 206, a reference voltage is applied at the input node. The application of the reference voltage at the input node induces a second amount of charge proportional to a difference between the first voltage and the reference voltage on an integration capacitor. Step 208 determines a first difference between the first voltage and the reference voltage based on a second amount of charge on the integration capacitor. At step 210, whether a touch input to the touch sensor has occurred is determined based on the first difference, at which point the method may end. Although this disclosure describes and illustrates particular steps of the method of FIG. 9 as occurring in a particular order, this disclosure contemplates any suitable steps of the method of FIG. 9 occurring in any suitable order. Moreover, although this disclosure describes and illustrates particular components carrying out particular steps of the method of FIG. 9, this disclosure contemplates any suitable combination of any suitable components carrying out any suitable steps of the method of FIG. 9.

Herein, reference to a computer-readable storage medium encompasses one or more non-transitory, tangible computer-readable storage media possessing structure. As an example and not by way of limitation, a computer-readable storage medium may include a semiconductor-based or other IC (such, as for example, a field-programmable gate array (FPGA) or an ASIC), a hard disk, an HDD, a hybrid hard drive (HHD), an optical disc, an optical disc drive (ODD), a magneto-optical disc, a magneto-optical drive, a floppy disk, a floppy disk drive (FDD), magnetic tape, a holographic storage medium, a solid-state drive (SSD), a RAM-drive, a SECURE DIGITAL card, a SECURE DIGITAL drive, or another suitable computer-readable storage medium or a combination of two or more of these, where appropriate.

Herein, "or" is inclusive and not exclusive, unless expressly indicated otherwise or indicated otherwise by context. Therefore, herein, "A or B" means "A, B, or both," unless expressly indicated otherwise or indicated otherwise by context. Moreover, "and" is both joint and several, unless expressly indicated otherwise or indicated otherwise by context. Therefore, herein, "A and B" means "A and B, jointly or severally," unless expressly indicated otherwise or indicated otherwise by context.

This disclosure encompasses all changes, substitutions, variations, alterations, and modifications to the example embodiments herein that a person having ordinary skill in the art would comprehend. Similarly, where appropriate, the appended claims encompass all changes, substitutions, variations, alterations, and modifications to the example embodiments herein that a person having ordinary skill in the art would comprehend. Moreover, reference in the appended claims to an apparatus or system or a component of an apparatus or system being adapted to, arranged to, capable of, configured to, enabled to, operable to, or operative to perform a particular function encompasses that apparatus, system, component, whether or not it or that particular function is activated, turned on, or unlocked, as long as that apparatus, system, or component is so adapted, arranged, capable, configured, enabled, operable, or operative.

What is claimed is:

1. A method comprising:
    coupling a capacitance of a touch sensor in series with a compensation capacitor;
    applying a supply voltage at the compensation capacitor, thereby dividing a first amount of charge between the capacitance of the touch sensor and the compensation capacitor, the division of the first amount of charge resulting in a first voltage at an input node;
    applying a reference voltage at the input node, the application of the reference voltage at the input node inducing a second amount of charge proportional to a difference between the first voltage and the reference voltage on an integration capacitor;
    determining a first difference between the first voltage and the reference voltage based on a second amount of charge on the integration capacitor; and
    determining whether a touch input to the touch sensor has occurred based on the first difference.

2. The method of claim 1, further comprising:
    reversing a polarity of the second amount of charge on the integration capacitor;
    dividing a third amount of charge between the capacitance of a touch sensor and the compensation capacitor, the division of the third amount of charge resulting in a second voltage at the input node;
    applying the reference voltage at the input node, the application of the reference voltage at the input node inducing a fourth amount of charge proportional to a difference between the second voltage and the reference voltage on an integration capacitor;
    summing the second and fourth amounts of charge on the integration capacitor; and
    determining whether the touch input to the touch sensor has occurred based on the second and fourth amounts of charge on the integration capacitor.

3. The method of claim 2, wherein dividing the third amount of charge comprises:
    applying the supply voltage at the capacitance of the touch sensor; and
    coupling the capacitance of the touch sensor in parallel with the compensation capacitor.

4. The method of claim 2, wherein reversing the polarity of the second amount of charge comprises reversing a configuration of the integration capacitor.

5. The method of claim 1, wherein the compensation capacitor comprises a capacitor external to a measurement circuit.

6. The method of claim 1, further comprising:
    modifying the capacitance of the compensation capacitor; and
    minimizing the difference between the first voltage in an absence of the touch input and a reference voltage.

7. A computer-readable non-transitory storage medium embodying logic configured when executed to:
    couple a capacitance of a touch sensor in series with a compensation capacitor;
    apply a supply voltage at the compensation capacitor, thereby dividing a first amount of charge between the capacitance of the touch sensor and the compensation capacitor, the division of the first amount of charge resulting in a first voltage at an input node;
    apply a reference voltage at the input node, the application of the reference voltage at the input node inducing a second amount of charge proportional to a difference between the first voltage and the reference voltage on an integration capacitor;
    determine a first difference between the first voltage and the reference voltage based on a second amount of charge on the integration capacitor; and
    determine whether a touch input to the touch sensor has occurred based on the first difference.

8. The medium of claim 7, wherein the logic is further configured to:
    reverse a polarity of the second amount of charge on the integration capacitor;

divide a third amount of charge between the capacitance of a touch sensor and the compensation capacitor, the division of the third amount of charge resulting in a second voltage at the input node;

apply the reference voltage at the input node, the application of the reference voltage at the input node inducing a fourth amount of charge proportional to a difference between the second voltage and the reference voltage on an integration capacitor;

sum the second and fourth amounts of charge on the integration capacitor; and determine whether the touch input to the touch sensor has occurred based on the second and fourth amounts of charge on the integration capacitor.

9. The medium of claim 8, wherein the logic is further configured to:

apply the supply voltage at the capacitance of the touch sensor; and couple the capacitance of the touch sensor in parallel with the compensation capacitor.

10. The medium of claim 8, wherein the logic is further configured to reverse a configuration of the integration capacitor.

11. The medium of claim 7, wherein the compensation capacitor comprises a capacitor external to a measurement circuit.

12. The medium of claim 7, wherein the logic is further configured to:

modify the capacitance of the compensation capacitor; and minimizing the difference between the first voltage in an absence of the touch input and a reference voltage.

13. A device comprising:

a measurement circuit; and a computer-readable non-transitory storage medium coupled to the measurement circuit and embodying logic configured when executed to:

couple a capacitance of a touch sensor in series with a compensation capacitor;

apply a supply voltage at the compensation capacitor, thereby dividing a first amount of charge between the capacitance of the touch sensor and the compensation capacitor, the division of the first amount of charge resulting in a first voltage at an input node;

apply a reference voltage at the input node, the application of the reference voltage at the input node inducing a second amount of charge proportional to a difference between the first voltage and the reference voltage on an integration capacitor;

determine a first difference between the first voltage and the reference voltage based on a second amount of charge on the integration capacitor; and determine whether a touch input to the touch sensor has occurred based on the first difference.

14. The device of claim 13, wherein the logic is further configured to:

reverse a polarity of the second amount of charge on the integration capacitor;

divide a third amount of charge between the capacitance of a touch sensor and the compensation capacitor, the division of the third amount of charge resulting in a second voltage at the input node;

apply the reference voltage at the input node, the application of the reference voltage at the input node inducing a fourth amount of charge proportional to a difference between the second voltage and the reference voltage on an integration capacitor;

sum the second and fourth amounts of charge on the integration capacitor; and determine whether the touch input to the touch sensor has occurred based on the second and fourth amounts of charge on the integration capacitor.

15. The device of claim 14, wherein the logic is further configured to:

apply the supply voltage at the capacitance of the touch sensor; and couple the capacitance of the touch sensor in parallel with the compensation capacitor.

16. The device of claim 13, wherein the compensation capacitor comprises a capacitor external to the measurement circuit.

17. The device of claim 13, wherein the logic is further configured to:

modify the capacitance of the compensation capacitor; and minimizing the difference between the first voltage in an absence of the touch input and a reference voltage.

* * * * *